(12) United States Patent
Hong

(10) Patent No.: US 8,749,961 B2
(45) Date of Patent: Jun. 10, 2014

(54) DISPLAY APPARATUS

(75) Inventor: Changsung Hong, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 211 days.

(21) Appl. No.: 13/508,325

(22) PCT Filed: Nov. 4, 2010

(86) PCT No.: PCT/KR2010/007754
§ 371 (c)(1),
(2), (4) Date: May 4, 2012

(87) PCT Pub. No.: WO2011/055997
PCT Pub. Date: May 12, 2011

(65) Prior Publication Data
US 2012/0218697 A1    Aug. 30, 2012

(30) Foreign Application Priority Data

Nov. 4, 2009    (KR) .................. 10-2009-0106210

(51) Int. Cl.
*G06F 1/16*    (2006.01)
(52) U.S. Cl.
USPC ............... 361/679.06; 248/276.1; 348/836; 345/104
(58) Field of Classification Search
USPC ............ 248/188, 125.7, 276.1, 205.1, 206.5; 348/836, 825, 468, 240.99; 361/679.01, 679.27, 679.02, 679.26, 361/679.4, 679.05, 679.43, 679.04, 679.28, 361/679.22, 679.59, 679.58, 679.55, 361/679.29, 679.07, 679.41; 345/157, 163, 345/102, 205, 426, 80, 427, 104
See application file for complete search history.

(56) References Cited

U.S. PATENT DOCUMENTS

| 6,867,962 | B2 | 3/2005 | Cho et al. | |
|---|---|---|---|---|
| 2008/0192417 | A1* | 8/2008 | Hwang et al. | 361/681 |
| 2009/0268108 | A1* | 10/2009 | Hamada | 348/836 |
| 2010/0096518 | A1* | 4/2010 | Wang et al. | 248/125.7 |
| 2012/0057282 | A1* | 3/2012 | Wang et al. | 361/679.01 |

FOREIGN PATENT DOCUMENTS

| KR | 2003-0053982 A | 7/2003 |
|---|---|---|
| KR | 10-2004-0089200 A | 10/2004 |
| KR | 10-2006-0008741 A | 1/2006 |
| KR | 10-2008-0015607 A | 2/2008 |

* cited by examiner

*Primary Examiner* — Hung Duong
(74) *Attorney, Agent, or Firm* — Birch, Stewart, Kolasch & Birch, LLP

(57) ABSTRACT

Provided is a display apparatus. A stand type of the display apparatus may be converted into a tilt type or a flip type as necessary.

18 Claims, 8 Drawing Sheets

DISPLAY APPARATUS

TECHNICAL FIELD

The present disclosure relates to a display apparatus.

BACKGROUND ART

As an information-oriented society develops, needs for diverse forms of display apparatuses are increasing. Accordingly, research has been carried out on various display apparatuses such as liquid crystal display devices (LCDs), plasma display panels (PDPs), electro luminescent displays (ELDs), vacuum fluorescent displays (VFDs), and organic light emitting diode modules (OLEDs), which have been commercialized. The display apparatus has a function in which image and sound signals are received from other devices to output the received signals through a display module and a speaker.

The display apparatus may be used in various forms according to consumer's taste or need. For example, a user may use the display apparatus in a state where it is mounted on a floor or predetermined furniture such as a table. Also, the user may use the display apparatus in a state where it is hung on a well.

In case where the display apparatus is mounted on the floor or predetermined furniture, the display apparatus may be largely classified into two types. One is a tilt stand type in which a base contacts a floor with a wide area and a main body of the display apparatus is mounted on the base. The other one is a flip stand type in which a main body directly contacts a floor and is supported on the back.

However, according to the above-described related art, there are following limitations.

The user does not voluntarily select one of the stand types of the display apparatus according to the consumer's taste or need after the user purchases a product.

Also, even though the user may voluntarily select one of the stand types of the display apparatus, a process for converting the types is complicated.

DISCLOSURE OF INVENTION

Technical Problem

Embodiments provide a display apparatus in which a stand type thereof can be converted into a tilt type or a flip type as necessary.

Embodiments also provide a display apparatus in which a stand type thereof can be easily converted.

Solution To Problem

In one embodiment, a display apparatus includes: a main body including a display module on which an image is displayed; a support unit rotatably coupled to a back surface of the main body; and an elastic member selectively maintaining one of a first state in which the support unit and the main body are disposed at an acute angle relative to each other and a second state in which the support unit and the main body are disposed at an angle greater than the acute angle relative to each other in the support unit.

The details of one or more embodiments are set forth in the accompanying drawings and the description below. Other features will be apparent from the description and drawings, and from the claims.

Advantageous Effects of Invention

In the display apparatus according to the embodiment, the stand type may be converted into the tilt type or the flip type as necessary.

Also, the conversion process may be simply performed without coupling or releasing the bolt.

MODE FOR THE INVENTION

Reference will now be made in detail to the embodiments of the present disclosure, examples of which are illustrated in the accompanying drawings.

Figure 1:
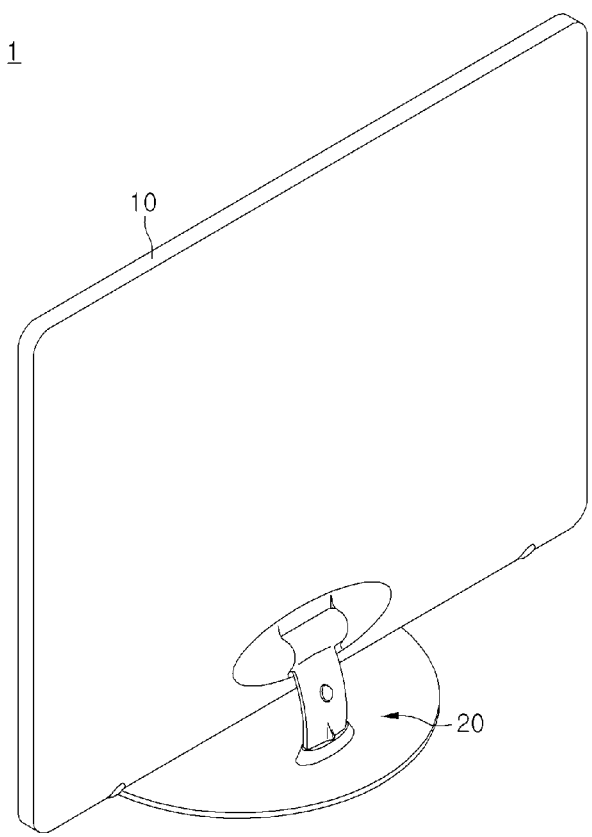
FIG. 1 is a perspective view of a tilt type display apparatus according to an embodiment.

FIG. 1 is a perspective view of a tilt type display apparatus according to an embodiment.

Referring to FIG. 1, a display apparatus according to an embodiment includes a display main body 10 on which an image is displayed and a stand assembly 20 supporting the main body 10.

The main body 10 may include a display module (not shown) on which the image is displayed, a case surrounding front and rear surfaces of the display module to protect the display module against an external impact and an inflow of foreign substances, and a speaker module (not shown) disposed inside a space defined by the case to output sound.

The display module emits light in a front direction of the display apparatus 1 to display an image. For example, the display module may be a liquid crystal display module. In this case, the display module may include a display panel (not shown) and a backlight unit (not shown).

The display panel may display an image using light emitted from the backlight unit. For this, the display panel may include a liquid crystal layer, a TFT substrate, and a color filter substrate. Here, the TFT substrate and the color filter substrate may face each other with the liquid crystal layer therebetween. Hereinafter, an example in which the liquid crystal display module is used as the display module will be described.

However, embodiments of the present disclosure are not limited to the liquid crystal module. For example, various display modules such as a plasma display panel (PDP), an electro luminescent display (ELD), a vacuum fluorescent display (VFD), a light emitting diode module (LED), and an organic light emitting diode module (OLED) may be used as the display module.

The stand assembly 20 supporting the main body 10 is coupled to a side of the main body 10. The stand assembly 20 is rotatably coupled to the main body 10. That is, the main body 10 may be vertically rotatable with respect to an upper end of the stand assembly 20.

The main body 10 may be used in a tilt type and a flip type according to a manipulation of the stand assembly 20. In detail, the tilt type display apparatus may be used in a state where the main body 10 is mounted on a base 21 (that will be described later) and vertically rotatable. The flip type display apparatus may be used in a state where the main body 10 is directly mounted on the floor. When the display apparatus 1 is used in the flip type, the stand assembly 20 may support the main body 10 so that the main body 10 does not fall down.

Hereinafter, a specific structure of the display apparatus 1 will be described with reference to the accompanying drawings.

Figure 2:
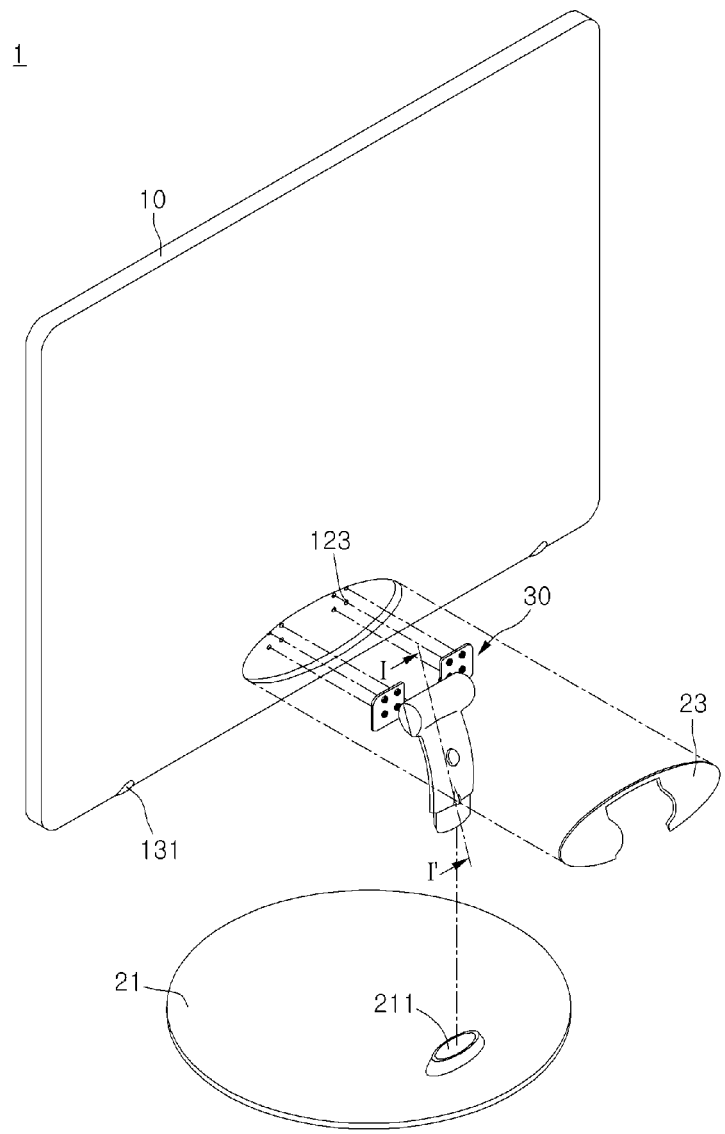
FIG. 2 is an exploded perspective view of a stand assembly of FIG. 1.
Figure 3:
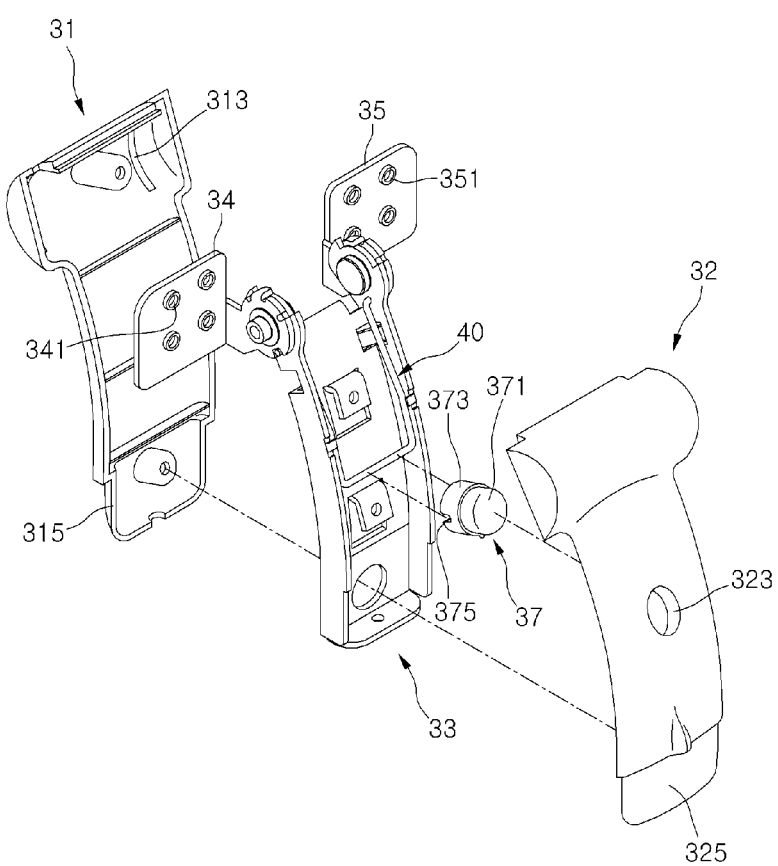
FIG. 3 is an exploded perspective view of a support unit of FIG. 2.
Figure 4:
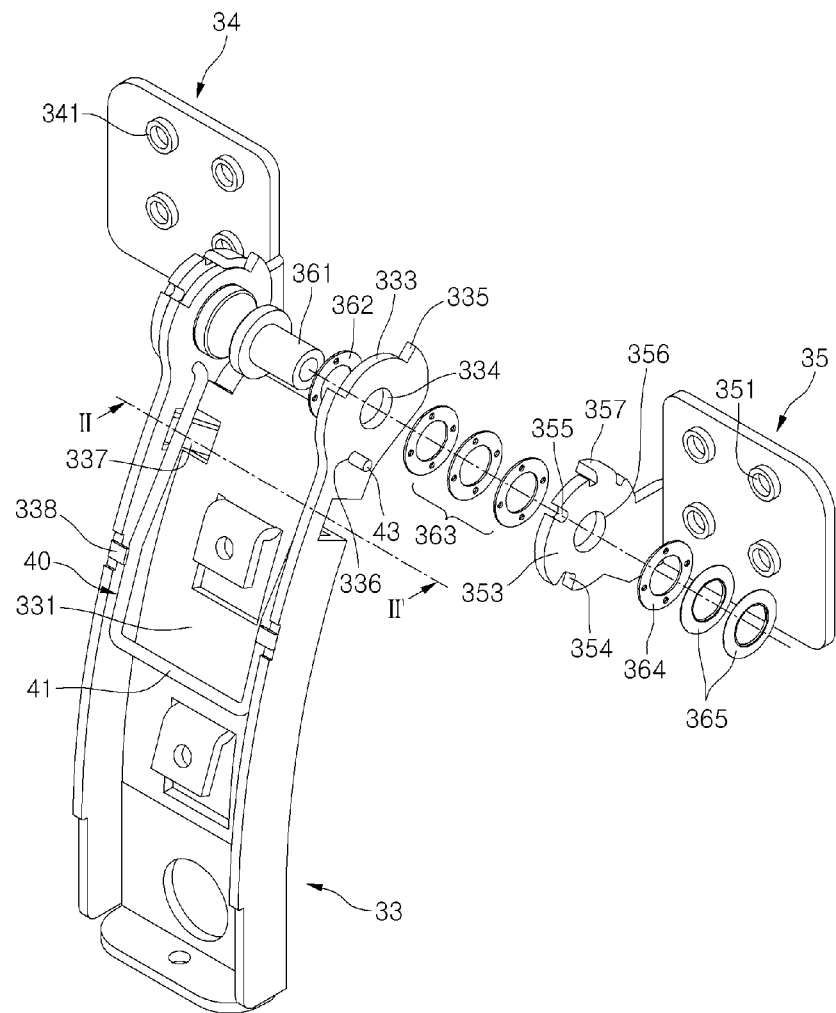
FIG. 4 is an exploded perspective view illustrating a state in which a left bracket is coupled to a body of the support unit of FIG. 3.
Figure 5:
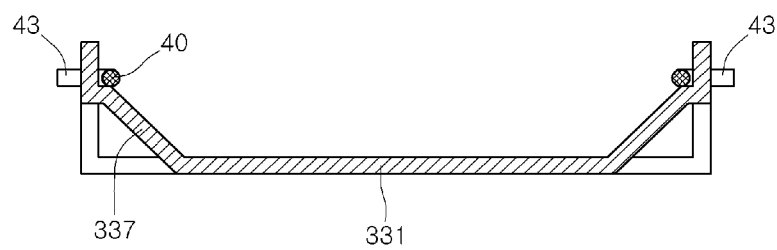
FIG. 5 is a sectional view taken along line II-II' of FIG. 4.

FIG. 2 is an exploded perspective view of a stand assembly of FIG. 1, and FIG. 3 is an exploded perspective view of a support unit of FIG. 2. FIG. 4 is an exploded perspective view illustrating a state in which a left bracket is coupled to a body of the support unit of FIG. 3, and FIG. 5 is a sectional view taken along line II-II' of FIG. 4.

Referring to FIGS. 2 to 5, a slipping prevention part 131 may be disposed on a lower end of the main body 10. When the display apparatus 1 is used in the flip type, the slipping prevention part 131 may absorb an impact applied to the main body 10, prevent the case from being damaged, and prevent the main body 10 from slipping. The slipping prevention part 131 may be formed of a material such as rubber having high friction coefficient. Also, the slipping prevention part 131 may be detachably provided so that it is attached to the main body 10 only when the display apparatus 1 is used the flip type.

The stand assembly 20 may be bolt-coupled to a back surface of the main body 10. A coupling hole 123 to which the stand assembly 20 is bolt-coupled may be defined in the back surface of the main body 10.

The stand assembly 20 may include a support unit 30 having a side rotatably coupled to the main body 10 and a base 21 selectively coupled to an end of the support unit 30. Also, the stand assembly 20 may further include a stand cover 23 covering a coupled portion of the main body 10 and the support unit 30.

The base 21 may have a predetermined area to stably support the main body 10 in a state where the base 21 is placed on the floor. A support unit insertion groove 211 in which the support unit 30 is selectively inserted may be defined in a top surface of the base 21. The support unit insertion groove 211 may have a size and shape corresponding to those of the end of the support unit 30 to prevent the support unit 30 from shaking after the support unit 30 is inserted.

The stand cover 23 prevents foreign substances from being introduced into the coupled portion of the main body 10 and the support unit 30. In addition, the stand cover 23 covers the coupled portion of the main body 10 and the support unit 30 to realize an elegant outer appearance. A portion of the stand cover 23 may be cut to smoothly move the support unit 30.

The support unit 30 has one side end rotatably coupled to the back surface of the main body 10 and the other side end inserted into the support unit insertion groove 211. In detail, the support unit 30 may include a body 33 in which an elastic member 40 is provided, brackets 34 and 35 rotatably connected to both sides of the body 33, front and back covers 31 and 32 surrounding a circumference of the body 33, and a button 37 compressing the elastic member 40.

The body 33 may be formed of a metal material having a predetermined strength to endure a load of the main body 10. The body 33 may include a frame 331 defining a space in which the elastic member 40 is received and heads 333 disposed on both ends of the frame 331 to allow a hinge shaft 361 to be inserted.

The frame 331 may be formed so that both sides of the plate material is bent to have a ˹ ˺ shape. The frame 331 defines the space in which the elastic member 40 is received. A guide 337 for guiding the movement of the elastic member 40 is disposed inside the frame 331. The guide 337 may be inclined so that it further protrudes toward the outside of the frame 331. The elastic member 40 is moved in a state where it is closely attached to the guide 337. The elastic member 40 is positioned at a starting point of the inclined portion of the guide 337 before an external force is applied to the elastic member 40 by a button 37 (that will be described later). Also, when the external force is applied to the elastic member 40 by the button 37, the elastic member 40 is moved along the guide 337 and deformed. A specific content related to this will be described later.

The elastic member 40 selectively restricts relative motion of the body 33 with respect to the brackets 34 and 35. In detail, the elastic member may include a member having electricity and a 'U' shape. The elastic member may be formed of a metal material such as a spring steel having a predetermined strength so that it is inserted into an elastic member insertion hole 336 (that will be described later) of the bracket 34 to support the load of the main body 10.

The elastic member 40 includes a hook part 41 inserted into a hook groove 375 defined in the button 37 and a bent part 43. Here, both ends of the elastic member 40 are outwardly bent at an angle of about 90° to form the bent part 43. The bent part 43 has a sufficient length so that it passes through each of the heads 333 to interfere with the brackets 34 and 35. Particularly, the bent part 43 may have a length longer than a strain of the elastic member 40 to prevent the elastic member 331 from being separated from the frame 331 even though the elastic member 40 is deformed.

The elastic member 40 is received into an inner space the frame 331. Since the bent part 43 is inserted into the head 333 or the elastic member insertion hole 336 defined at any position of the frame 331 adjacent to the head 333, the elastic member 40 is fixed to the body 33. Thus, the elastic member 40 may be rotated on the bent part 43 inserted into the elastic member insertion hole 336. The elastic member insertion hole 336 is defined in a position at which the elastic member 40 is maintained in a state in which it is closely attached to the guide 337. Also, since the elastic member 40 interferes with elastic member separation prevention ribs 338 disposed on the button 37 and the frame 331, the elastic member 40 stays in the inner space of the frame 331.

The heads 333 are disposed on both ends of the frame 331. Also, each of the heads 333 has a shaft hole 334 through which the hinge shaft 361 for the rotation motion of the body 33 passes. Furthermore, a restriction protrusion 335 may be disposed on an outer circumference of the head 333. The restriction protrusion 335 interferes with a hook protrusion 357 (that will be described later) to restrict a rotation angle of the body 33. The restriction protrusion 335 may be disposed on each of both sides of the head 333 to restrict upward and downward rotation of the body 33.

A left bracket 34 and a right bracket 35, which are coupled to the back surface of the main body 10 are disposed on left and right sides of the body 33, respectively. Coupling holes 341 and 351 are defined in the brackets 34 and 35 to allow the support unit 30 to be firmly fixed to the main body 10 using bolts. Although the brackets are disposed on both sides of the body 33 in the current embodiment, the present disclosure is not limited thereto. For example, one bracket may be coupled to both sides of the body 33.

Since the left bracket 34 and the right bracket 35 are disposed approximately symmetric to each other, for convenience of description, only the right bracket will be described as an example.

The right bracket 35 may be formed of a metal material having a predetermined strength to support the load of the main body 10. Also, the right bracket 35 includes an arm 353, which is bent backward to face the head 333.

A shaft hole 356 through which the hinge shaft 361 passes is defined in the arm 353 at a position corresponding to that of the shaft hole 334 of the body 33. Thus, the body 33 may be relatively rotated with respect to the right bracket 35 around the hinge shaft 361. Also, a hook protrusion 357 for restricting the rotation angle of the body 33 is disposed at a side of the arm 353. As described above, the hook protrusion interferes with the restriction protrusion to prevent the body 33 from being vertically rotated at an angle greater than a predetermined angle.

Fixing grooves 354 and 355 in which the bent part 43 passing through the head 333 is inserted may be defined in the arm 353. The fixing grooves 354 and 355 may include a first fixing groove 354 in which the bent part 43 is inserted when the display apparatus 1 is used in the tilt type and a second fixing groove 355 in which the bent part 43 is inserted when the display apparatus 1 is used in the flip type.

The first fixing groove 354 may be defined so that the bent part 43 is movable along an inner surface of the first fixing groove 354 by a predetermined distance. Thus, when the display apparatus 1 is used in the tilt type, the vertical angle of the main body 10 may be adjusted.

Also, the fixing grooves 354 and 355 are defined in a moving track of the bent part 43 so that the bent part is inserted while the body 33 is rotated. The second fixing groove 355 may be spaced a predetermined distance from the first fixing groove so that the body 33 is sufficiently rotated.

Although two fixing grooves are provided as an example in the current embodiment, the present disclosure is not limited thereto. For example, more fixing grooves may be provided to allow an image surface of the display apparatus 1 to be oriented at various angles. Also, the structure in which the bent part 43 is inserted may have a hole shape, but the groove shape.

A case in which the bent part 43 is inserted into the first fixing groove 354 and the display apparatus 1 is used in the tilt type may be referred to as a first state. Also, a case in which the bent part 43 is inserted into the second fixing groove 355 or the other groove and the display apparatus 1 is used in the flip type may be referred to as a second state.

The right bracket 35 is connected to the body 33 by the hinge shaft 361. The hinge shaft 361 passes through the shaft holes 334 and 356. Here, washers 362 and 364 may be disposed on lateral surfaces of the head 333 and the arm 353 to allow the body 33 to be smoothly rotated.

Also, at least one washer 363 is disposed between the head 333 and the arm 353 to space the head 333 from the arm 353 by a predetermined distance. Thus, when the bent part 43 has a length increasing by a length of the washer 363, the bent part 43 can be inserted into the fixing grooves 354 and 355.

Accordingly, when the bent part 43 gets out the fixing grooves 354 and 355, the bent part 43 may get out the elastic member insertion hole 336 at a time to prevent the elastic member 40 from being separated from the body 33 because the strain of the elastic member 40 is very large. Thus, the number of washer 363 may be adequately adjusted so that a distance between the head 335 and the arm 353 is shorter than the strain of the elastic member 40. Since the washer 363 spaces the body 330 from the bracket 35, the washer 363 may be referred to as a spacer.

A disk spring 365 may be rivet-coupled to an end of the hinge shaft 361.

The contents with respect to the right bracket 24 may be applied to the left bracket 34.

A front side of the body 33 is protected by the front cover 31. A hinge part insertion hole 313 in which the coupled portion of the arm 353 and the head 333 is inserted is vertically defined in an upper end of the front cover 31. The coupled portion of the arm 353 and the head 333 may be inserted into the hinge part insertion hole 313 from an upper side of the front cover 31 toward a lower side. Thus, a coupled structure of the body 33 and the brackets 34 and 35 may be coupled to the front cover 31. After the front cover 31 is coupled, the front cover 31 is positioned at a rear direction of the brackets 34 and 35.

A back side of the body 33 is protected by the back cover 32. After the front cover 31 is inserted into the coupled structure of the body 33 and the brackets 34 and 35, the back cover 32 may be coupled to the body 33 and the front cover 31 using the blots. A button insertion part 323 in which the button 37 is inserted is defined in the back cover 32. The button 37 is inserted into the button insertion part 323. A portion of the button 37 may be exposed to the outside of the button insertion part 323. The button 37 may be moved in a straight line motion to compress the elastic member 40. The button insertion part 323 is disposed at a position corresponding to that of the hook part 41.

The button 37 may be operated in a push-to-type to compress the elastic member 40. The button 37 includes a push part 371 passing through the button insertion part 323 and exposed to the outside, an interference part 373 protruding from an outer surface of the push part 371 by a predetermined length to prevent the button 37 from being separated, and a hook groove 375 in which the hook part 41 is inserted.

The button 37 is coupled to the body 33 to allow the hook part 41 to be inserted into the hook groove 375. The back cover 32 is assembled after it is coupled to the body 33. Also, the push part 371 may be slidable along the button insertion part 323 in a front or rear direction of the back cover 32. When the user pushes the push part 371, the hook part 41 may be compressed. When the hook part 43 is compressed, the elastic member 40 is rotated with respect to the bent part 43.

Also, insertion parts 315 and 325 are disposed at lower portions of the front cover 31 and the back cover 32, respectively. The insertion parts 315 and 325 are coupled to each other and inserted into the support unit insertion groove 211.

Hereinafter, the first state, the second states, conversion between the first and second states will be described with reference to the accompanying drawings.

Figure 7:
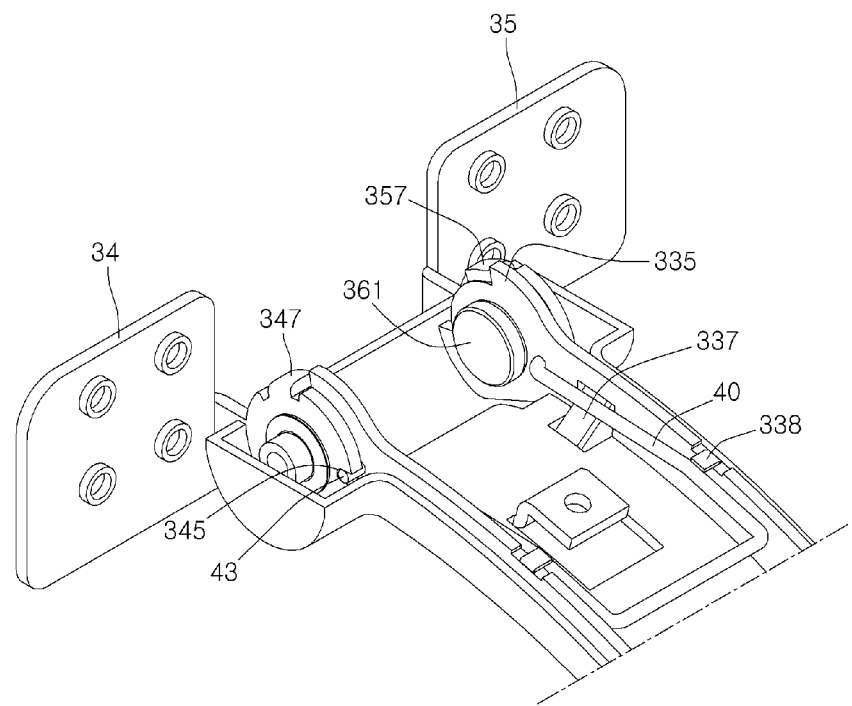
FIG. 7 is a view illustrating a position of a body with respect to a support bracket in a second state.
Figure 8:
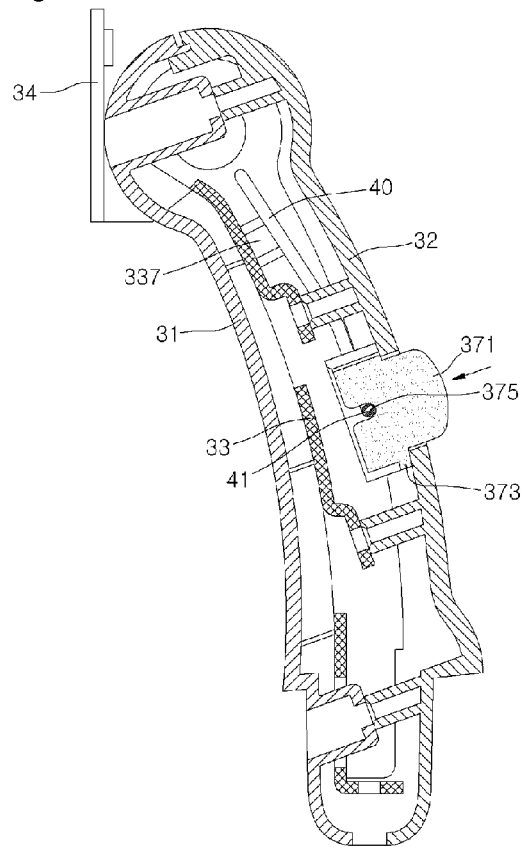
FIG. 8 is a sectional view taken along line I-I' of FIG. 2 before a button is pushed.

FIG. 7 is a view illustrating a position of the body with respect to the support bracket in a second state, and FIG. 8 is a sectional view taken along line I-I' of FIG. 2 before the button is pushed.

Figure 6:
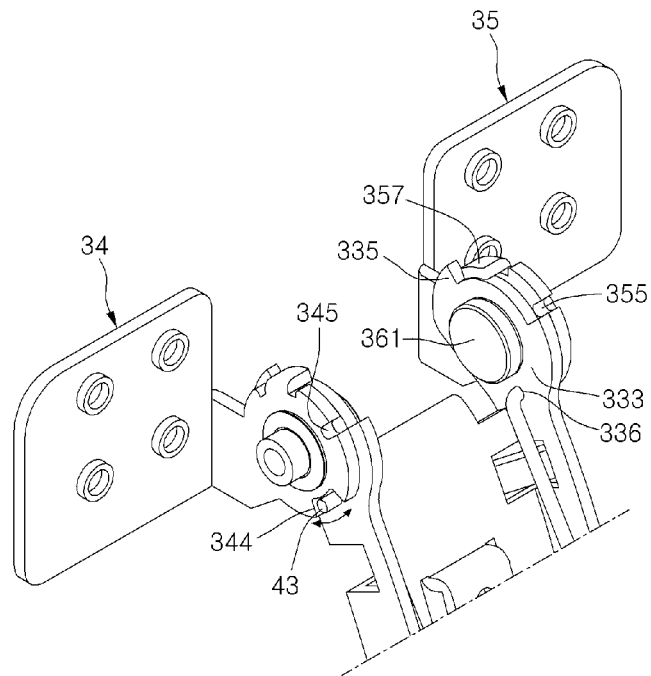
FIG. 6 is a view illustrating a position of a body with respect to a support bracket in a first state.

Referring to FIGS. 6 and 7, when the display apparatus 1 is used in the tilt type, i.e., in case of the first state, the bent part 43 passes through the insertion hole 336 and is inserted into the first fixing grooves 354 and 344. Here, the first fixing grooves 354 and 344 are defined so that the front cover 31 of the support unit 30 and the main body 10 are disposed at an acute angle relative to each other. Particularly, the front cover 31 of the support unit 30 and the main body 10 may have an angle of less than about 30° therebetween to more firmly support the main body 10.

Also, the first fixing grooves 354 and 344 are defined so that the bent part 43 is inwardly rotated. That is, the body 33 may be rotated at a predetermined angle. As shown in FIG. 6, the rotation angle of the body 33 is decided by a width of each of the first fixing grooves 354 and 344. For example, the first fixing grooves 354 and 344 may be defined so that the main body 10 is rotated at about 10° in an upper direction and in a lower direction. For example, an angle of the main body 10 when the bent part 43 is inserted into the first fixing grooves 354 and 344 may be maintained by a friction between the body 33 and the brackets 34 and 35.

In the first state, the display apparatus 1 is used in a state in which the base 21 is inserted.

The user may use the display apparatus 1 in the flip type, i.e., the second state converted from the first state. The user may remove the base 21 and pushes the button 37, and then, the user rotates the support unit 30 upward to convert the first state into the second state. A specific conversion process between the first state and the second state will be described below.

In the second state, the bent part 43 is inserted into the second fixing grooves 355 and 345. Each of the second fixing grooves 355 and 345 may have a shape corresponding to that of the bent part 43 to prevent the bent part 43 from shaking within the second fixing grooves 355 and 345 after the bent part 43 is inserted. An angle between the front cover 31 of the support unit 30 and the main body 10 in the second state is greater than that between the front cover 31 and the main body 10 in the first state. In detail, the second fixing grooves 355 and 345 may be adjusted in position so that an angle between the image surface of the main body 10 and the floor is within a range of about 90° to about 120°. Alternatively, a plurality of fixing grooves such as the second fixing grooves 355 and 345 may be further defined so that the user adjusts an angle of the main body 10.

Figure 12:
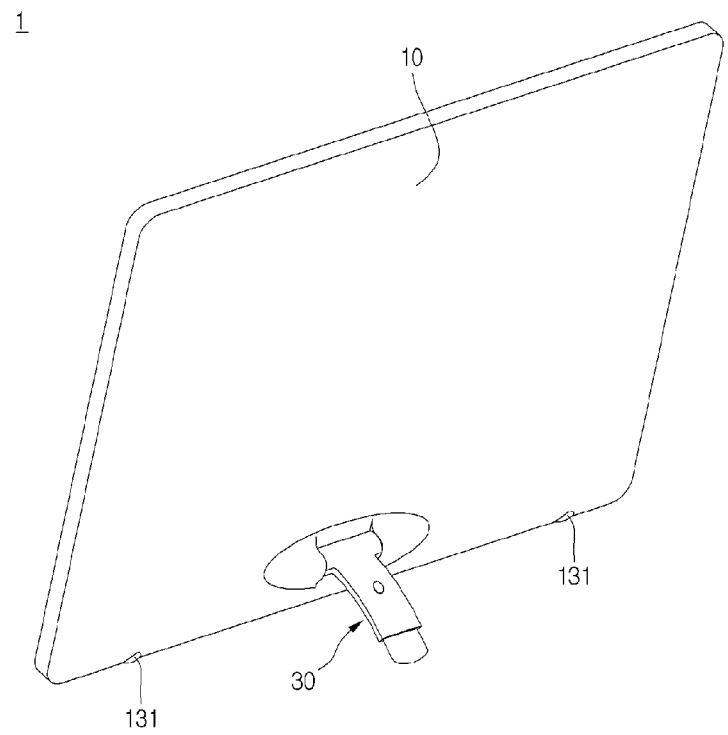
FIG. 12 is a perspective view of a flip type display apparatus according to an embodiment.

A case in which the display apparatus 1 is used as the second state is disclosed in FIG. 12. Referring to FIG. 12, the main body 10 may be disposed to allow the slipping prevention part 131 to be placed on the floor. Also, the body may be inclined at a pre-determined angle so that the load thereof is supported by the support unit 30.

Figure 9:
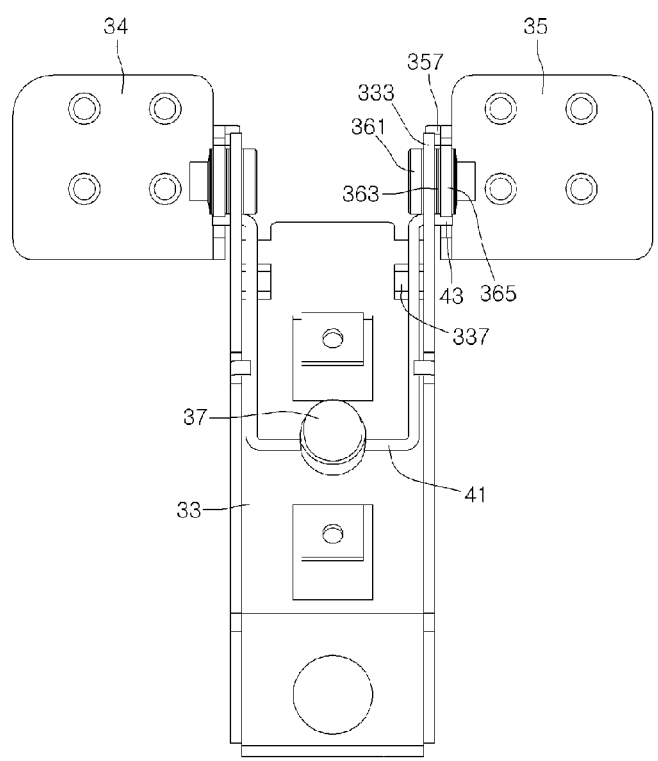
FIG. 9 is a view of an elastic member before a button is pushed.
Figure 10:
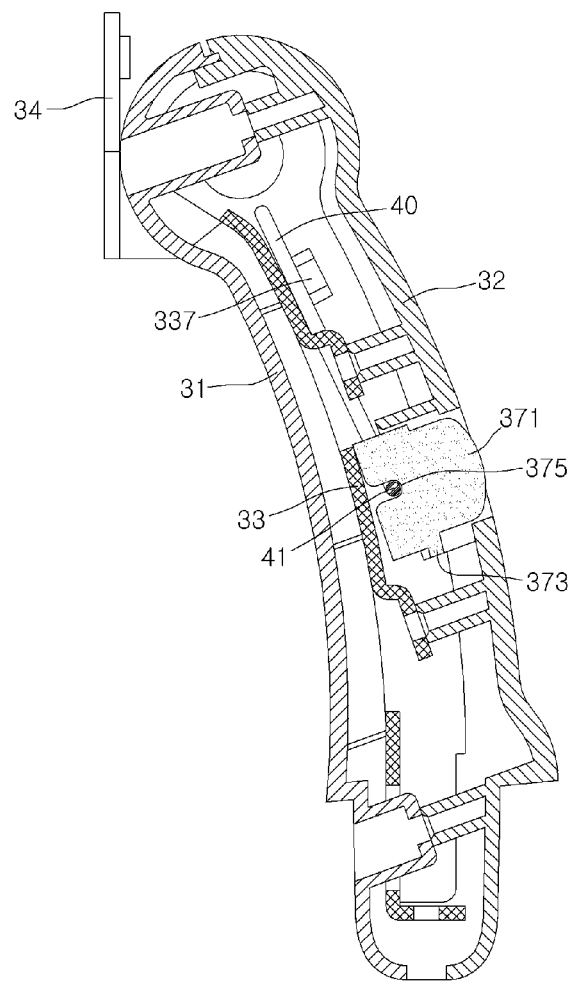
FIG. 10 is a sectional view taken along line I-I' of FIG. 2 after a button is pushed.
Figure 11:
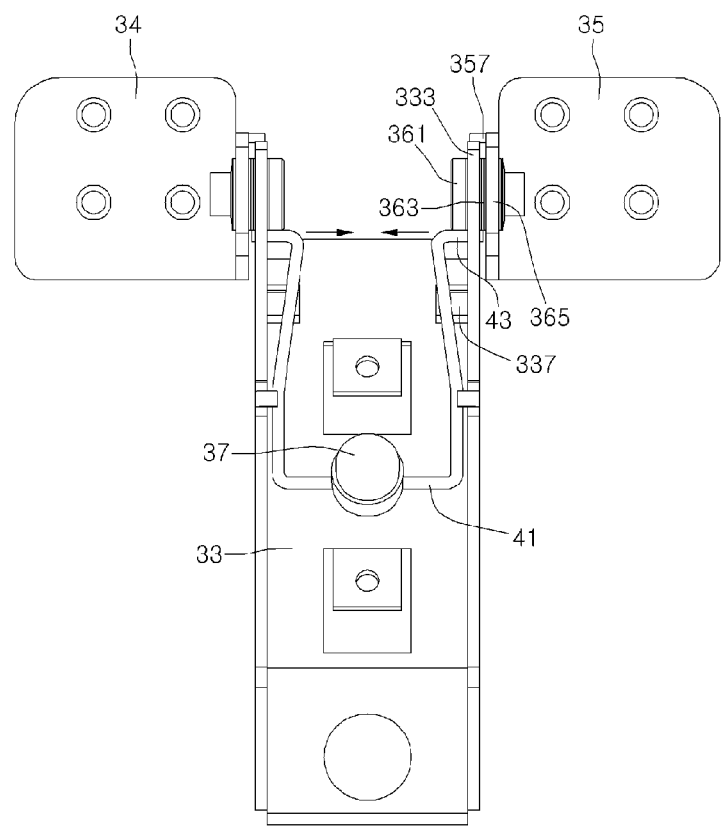
FIG. 11 is a view of an elastic member after a button is pushed.

FIG. 8 is a sectional view taken along line I-I of FIG. 2 before the button is pushed, and FIG. 9 is a view of the elastic member before the button is pushed. FIG. 10 is a sectional view taken along line I-I' of FIG. 2 after the button is pushed, and FIG. 11 is a view of the elastic member after the button is pushed.

Referring to FIGS. 8 to 11, it may be seen that states before and after the button 37 is pushed.

In detail, a state in which the button 37 is not pushed is provided in the first state. The push part 371 protrudes from the back cover 32 by a predetermined length. The elastic member 40 is disposed above the guide 337. Here, a state in which both sides of the elastic member 40 are not elastically deformed may be provided.

In this state, when the user pushes the button 37, the button 37 is guided to the button insertion part 323 and moved in a straight line motion. According to the movement of the button 37, the hook part 41 inserted into the hook groove 375 of the button 37 is moved along in a straight line motion. Since the bent part 43 is inserted into the elastic member insertion hole 336 and fixed to the body 33, the elastic member 40 is rotated forwardly with respect to the bent part 43. Here, since the guide 337 is inclined, the elastic member 40 is elastically deformed while being slid along the guide 337. That is, a side part of the elastic member 40 is bent toward a central portion of the body 33, and the bent part 43 is moved also in a center direction of the body 33.

When the bent part 43 is moved by a distance greater than a thickness of the arm 353, the restriction state of the body 33 and the brackets 34 and 35 due to the elastic member 40 is released. Thus, the body 33 may be rotatable with respect to the brackets 34 and 35. Here, the rotation angle of the body 33 may be restricted by the interference between the hook protrusion 357 and the restriction protrusion 335.

Also, the bent part 43 may have a sufficient long length by the washer 363 so that the bent part 43 is further deformed by a predetermined length after it gets out the brackets 34 and 35. Thus, it may prevent the bent part 43 from getting out the elastic member insertion hole 336 due to the deformation of the elastic member 40.

When the body 33 is rotated at a predetermined angle, the elastic member insertion hole 336 is disposed at a position corresponding to those of the second fixing grooves 355 and 345. Since the elastic member 40 is deformed when the body 33 is rotated, a restoring force acts on the bent part 43 in a direction of the brackets 34 and 35. Thus, the elastic member insertion hole 336 is disposed at the position corresponding to those of the second fixing grooves 355 and 345. When the user removes the force applied to the button 37, the bent part 43 is automatically inserted into the second fixing groove 355, and the button 37 may protrude again. That is, the first state is converted into the second state.

When the bent part 43 is rotated and inserted into the first fixing grooves 354 and 344 after the button 37 is compressed, the process in which the second state is converted into the first state may be performed.

In the above-described display apparatus according to the embodiments, the stand type of the display apparatus 1 may be converted into the tilt type or flip type as necessary.

Also, since the base is selectively coupled without coupling or releasing the bolt and the support unit is only rotated after the button is compressed to easily convert the stand type of the display apparatus, the user may easily use the display apparatus.

The present disclosure should not be construed as limited to the embodiments set forth herein and can easily be derived through adding, altering, and changing within the spirit and scope of the present disclosure.

The invention claimed is:

1. A display apparatus comprising:
    a main body comprising a display module on which an image is displayed;
    a support unit rotatably coupled to a back surface of the main body; and
    an elastic member selectively maintaining one of a first state in which the support unit and the main body are disposed at an acute angle relative to each other and a second state in which the support unit and the main body are disposed at an angle greater than the acute angle relative to each other in the support unit.

2. The display apparatus according to claim 1, further comprising a base selectively coupled to an end of the support unit, the base being placed on a floor,
    wherein the base is coupled to the support unit in the first state.

3. The display apparatus according to claim 1, wherein the support unit comprises:

a body on which the elastic member is mounted; and a bracket having one side coupled to the back surface of the main body and the other side connected to the body, wherein a portion of the elastic member selectively interferes with the bracket.

4. The display apparatus according to claim 3, wherein the first and second states are states in which the elastic member interferes with the bracket.

5. The display apparatus according to claim 3, wherein the support unit further comprises a button releasing the interference between the elastic member and the bracket.

6. The display apparatus according to claim 5, wherein the elastic member is protected by a cover surrounding the body, and a portion of the button is exposed to the outside of the cover.

7. The display apparatus according to claim 5, wherein at least a portion of the elastic member is deformed by compressing the button and selectively inserted into the bracket.

8. The display apparatus according to claim 7, further comprising a spacer, which spaces the body from the bracket so that a distance between the body and the bracket is less than a strain of the elastic member.

9. The display apparatus according to claim 3, wherein a plurality of fixing grooves in which the elastic member is inserted is defined in the bracket, and the elastic member interferes with the bracket by inserting a portion of the elastic member into the respective fixing grooves.

10. The display apparatus according to claim 1, wherein the support unit further comprises a button compressing the elastic member and is rotated in a state where the button is pushed.

11. The display apparatus according to claim 10, wherein the elastic member is protected by a cover surrounding the body, and a portion of the button is exposed to the outside of the cover.

12. The display apparatus according to claim 10, wherein at least a portion of the elastic member is deformed by compressing the button and selectively inserted into the bracket.

13. The display apparatus according to claim 12, further comprising a spacer, which spaces the body from the bracket so that a distance between the body and the bracket is less than a strain of the elastic member.

14. The display apparatus according to claim 1, wherein a slipping prevention part is disposed on a lower end of the main body.

15. The display apparatus according to claim 3, wherein a plurality of fixing grooves in which the elastic member is selectively inserted is defined in the bracket.

16. The display apparatus according to claim 3, wherein a restriction protrusion is disposed on the body and a hook protrusion is disposed on the bracket to restrict a rotation angle of the body by interference between the restriction protrusion and the hook protrusion.

17. The display apparatus according to claim 16, wherein the elastic member is moved along the guide by compression of the button.

18. The display apparatus according to claim 3, wherein a guide inclinedly protruding in a direction crossing a compression direction of the button is disposed on the body.

* * * * *